United States Patent [19]

Keller et al.

[11] 3,775,697

[45] Nov. 27, 1973

[54] ELECTRONIC CIRCUIT FOR A QUARTZ CRYSTAL WATCH

[75] Inventors: Hans Keller, Freiburg; Walter Kreitz, Mundingen, both of Germany

[73] Assignee: ITT Industries, Inc., New York, N.Y.

[22] Filed: Sept. 22, 1972

[21] Appl. No.: 290,919

[30] Foreign Application Priority Data

Jan. 21, 1972 Germany.................. P 22 02 762.9

[52] U.S. Cl................... 331/74, 58/23 A, 307/213, 331/108 D, 331/116 R

[51] Int. Cl........................... G04c 3/00, H03b 5/36

[58] Field of Search............ 331/74, 108 C, 108 D, 331/116 R, 113 R; 58/23 R, 23 A, 23 AC; 318/128; 307/213

[56] References Cited

UNITED STATES PATENTS

| | | | |
|---|---|---|---|
| 3,684,981 | 8/1972 | Kreitz | 331/116 R |
| 3,534,544 | 10/1970 | Oguey et al. | 58/23 A |
| 3,479,812 | 11/1969 | Kramer | 331/116 R |

OTHER PUBLICATIONS

Elektronik, 1971, No. 8, pp. 261–264.

*Primary Examiner*—Roy Lake
*Assistant Examiner*—Siegfried H. Grimm
*Attorney*—C. Cornell Remsen, Jr. et al.

[57] ABSTRACT

There is disclosed an electronic circuit for a quartz crystal wrist watch including a quartz crystal oscillator, bistable flip-flop frequency divider stages and a motor driver circuit. A common multiple transistor constant current source feeds the oscillator and frequency divider. The constant current source and oscillator transistors are of the same conductivity type and complementary to the frequency divider transistors. This arrangement reduces the effect of battery voltage changes caused by motor driver pulses and improves the accuracy of the watch.

5 Claims, 2 Drawing Figures

ELECTRONIC CIRCUIT FOR A QUARTZ CRYSTAL WATCH

BACKGROUND OF THE INVENTION

This invention relates to an electronic watch and more particularly to the electronic circuit of a quartz crystal wrist watch.

In an article published in "Elektronik," 1971, No. 8, pages 261 to 264, the inventors have described a bipolar monolithic integrated semiconductor circuit for quartz crystal wrist watches with the electronic circuit thereof consisting of a quartz crystal oscillator, a frequency divider and a motor driver IC (integrated circuit), with the latter driving a stepping motor, balance motor or the like serving to drive the hand-moving mechanism.

There are two basic circuits for a quartz crystal oscillator that have proven to be well suited for watches. One of these circuits is described in the aforementioned article and consists of one single correspondingly designed transistor. The other of these circuits consists of two transistors which are cross-coupled as regards their base and collector electrodes, with the quartz crystal connected between the two emitters and being operated in series resonance. This circuit is known from the book by E. R. Hauri and A. E. Bachmann, "Grundlagen und Anwendungen der Transistoren," 2nd revised Edition, Berne 1965, pages 507 and 508, as well as from the French Patent specification No. 1,548,137.

The frequency divider circuit in quartz crystal watches, as a rule, consists of a certain number of series-connected flip-flop stages of the same type, each of which acts as a binary or count-by-two circuit having a 2:1 count-down ratio. Therfore, with n series-connected bistable flip-flop stages there can be achieved a frequency division by the factor $2^n$. As is clearly evident from the aforementioned article published in the technical journal "Elektronik," such bistable flip-flop stages for the use in quartz crystal watches are to be designed in such a way with respect to their special type of circuit so as to contain no ohmic resistors which would have to be very highly resistive. Rather the operating resistors of the flip-flop stages are to be replaced by transistors connected as constant current sources which, in turn, are combined to form one or more multiple constant current sources.

In the case of a monolithic integration of these frequency dividers in accordance with the bipolar technique, the transistors of the multiple constant current sources are complementary to the transistors of the bistable flip-flop stages, that is, in the case of integrated circuits manufactured in accordance with the conventional planar technique, the constant current source transistors are of the pnp-conductivity type while the flip flop transistors are of the npn-conductivity type.

In accordance with the aforementioned article in "Elektronik," the motor driver IC consists of a pulse shaper producing from the last bistable flip-flop stage of the frequency divider a pulse having the duration and power necessary for driving the stepping motors.

Accordingly, the invention relates to an electronic quartz crystal watch whose electronic circuit comprises a quartz oscillator, a multistage frequency divider consisting of bistable flip-flop stages, and a motor driver, with at least all active electronic circuit elements being combined in at least one bipolar monolithic integrated semiconductor circuit, and with the operating resistances of the quartz crystal oscillator, the frequency divider and the motor driven IC being constituted by transistors arranged to act as constant current sources and which, per integrated semiconductor circuit techniques, are combined to form at least one multiple constant current source.

As a rule, such types of electronic quartz crystal watches, as independent watches, are supplied with the energy required for operation from a dry battery. Especially in the case of wrist watches, owing to the small space available, it is only possible to provide as the supply voltage for the electronic circuit, the voltage of one single cell with the power contents and, consequently, also the maximum possible discharge rate thereof being restricted accordingly.

Of course, owing to the fact that the motor driver pulse is only a short one compared to the entire period of the frequency divider output pulse, it is possible and to some extent also customary, during the time of this short pulse, to cause the dry battery to deliver a current which is greater than the one actually corresponding to the maximum possible permanent discharge of a continuous direct current.

Investigations have shown, however, that in the course of such a mode of operation, there tends to arise the problem that owing to the finite internal resistance of the dry battery, the terminal voltage and, consequently, also the voltage supplying the electronic circuit of the quartz crystal watch drop off temporarily. This voltage difference may reach the order of the peak-to-peak value of the a.c. (alternating current) voltage generated by the oscillator circuit. In the case of an unfavorable phase relation between the pulse-shaped supply voltage drop and the oscillator a.c. voltage, faulty switching operations are likely to occur in the first bistable flip-flop stage of the frequency divider in such a way that also the pulse superimposed upon the supply voltage will effect an additional stepping on of this stage, so that the frequency divider, in the most unfavorable case, will receive one disturbing faulty pulse after every $2^n$ pulses, this causing a rate inaccuracy of the electronic watch.

SUMMARY OF THE INVENTION

Therefore, it is the object of the invention, by way of circuit techniques, to prevent the supply-voltage drop from having the aforementioned disturbing effect upon the accuracy of the electronic watch. With respect to the above-identified electronic quartz crystal watch, this problem is solved in accordance with the present invention, in that the transistors of the quartz oscillator circuit, including the associated constant current source transistors have a conductivity type which is complementary to that of the switching transistors in the flip-flop stages. One particularly advantageous further embodiment of the invention resides in the fact that a capacitor having a capacitance greater than 10 nf (nanofarad) is connected in parallel to the common base terminal of the transistors of the multiple constant current source.

A feature of the present invention is the provision of an electronic circuit for a quartz crystal watch comprising: a transistorized quartz crystal oscillator; a multistage frequency divider circuit including transistorized flip-flop stages having switching transistors; and a plurality of transistors substituted for operating resistors of the oscillator and the divider circuit, the plurality of transistors being connected to provide constant current sources; the transistors of the oscillator and the plurality of transistors are of a conductivity type which is complementary to the conductivity type of the switching transistors.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

Figure 1:
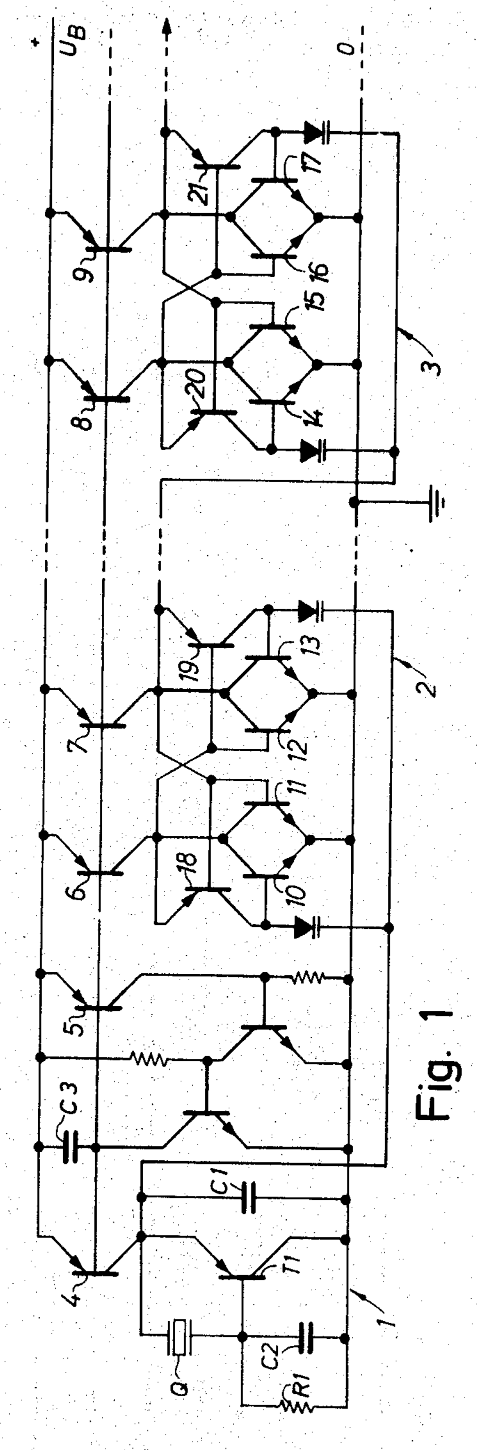
FIG. 1 is a schematic diagram of a portion of the electronic circuit of an electronic quartz crystal watch including a quartz crystal oscillator circuit containing one single transistor in accordance with the principles of the present invention.

FIG. 1 is a schematic diagram of a quartz oscillator circuit 1, two frequency-divider stages 2 and 3 and one multiple constant current source including transistors 4 to 9. The special circuits of the frequency divider stages 2 and 3 and of the multiple constant current source are only shown insofar as it is of interest within the scope of the present invention, which is that the switching transistors 10 to 17 of the frequency divider stages 2 and 3 as well as the control transistors 18 to 21 thereof are of the npn-conductivity type while transistors 4 to 9 of the multiple constant current source are of the pnp-conductivity type. Moreover, such frequency divider stages are described in detail in the "Elektronik" article cited hereinbefore.

As may be seen from FIG. 1, the inputs of the first flip-flop stage are controlled from an oscillator circuit consisting of one single transistor whose conductivity type, according to the invention, is complementary to that of the switching transistors 10 to 17 of the flip-flop stages 2 and 3, namely, of the pnp-conductivity type. This transistor T1 is arranged in such a way that its emitter is connected to the collector of transistor 4 of the same conductivity type which acts as a constant current source. The emitter of transistor 4 is connected to the voltage-conducting pole + of the supply-voltage source $U_B$.

At this point it should be noted that the multiple constant current source, in monolithic integration, is so designed as to consist of a lateral transistor of corresponding dimensions whose base and emitter zones are common to all of the individual collectors of the multiple constant current source and, in accordance with a particularly advantageous further embodiment of the invention, the capacitor C3 is connected in parallel to both the base terminal and the emitter terminal. The capacitance of capacitor C3 is to be greater than 10 nf in order to compensate disturbing effects of the base-emitter capacitance of the integrated multiple constant current source.

The quartz crystal Q is connected in parallel to the base-emitter path of transistor T1 while the collector-emitter path is bridged by a first capacitor C1. The base-collector path of transistor T1 is in parallel with the parallel circuit consisting of the resistor R1 and of the second capacitor C2. The collector of transistor T1 is connected to the zero point of the circuit, i.e. to circuit ground (0).

The advantage of selecting a complementary transistor for acting as the transistor of the oscillator circuit is in particular to be seen in the fact that in the case of a monolithic integration by employing the conventional planar technology, in which the " planar" transistors are of the npn-conductivity type, and, hence, this oscillator transistor is of the pnp-conductivity type, the oscillator transistor may be designed as a so-called substrate transistor. It, therefore, has a high current gain and, in addition thereto, its collector-base capacitance can be made very high, so that at least a portion of the capacitance of the second capacitor C2 according to FIG. 1 can be realized by this internal base-collector capacitance of transistor T1. This appears to be desirable because capacitors, as is well known, are only capable of being integrated in an economical manner when having relatively small capacitance values of some 10 pf (picofarad).

The term "substrate transistor" has reference to an arrangement in which the collector zone of a transistor, which, in monolithic integrated circuits, is usually arranged within an insulating island, serves as the base zone of the substrate transistor while the zone of the opposite conductivity type, which, in monolithic integrated circuits, is usually diffused as a base zone into the collector zone, acts as an emitter in the case of the substrate transistor, with the collector thereof being constituted by the insulating zones usually surrounding the zone acting as the collector zone. In addition, the substrate of the monolithic integrated circuit provides for a correspondingly large surface area of the collector-base-pn-junction.

Figure 2:
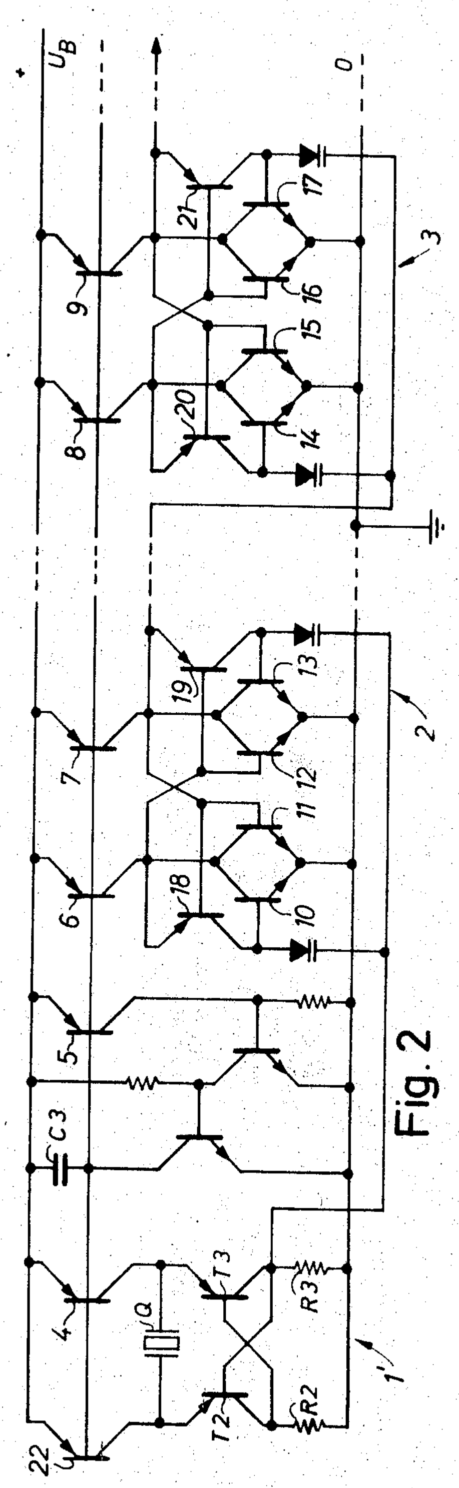
FIG. 2 is a schematic diagram of a portion of the electronic circuit of an electronic quartz crystal watch comprising a quartz crystal oscillator circuit containing two cross-coupled transistors in accordance with the principles of the present invention.

FIG. 2 illustrates a schematic diagram of another quartz crystal oscillator circuit 1' which may likewise serve to control the first flip-flop stage 2 of the frequency divider circuit of the electronic quartz crystal watch according to the principles of the present invention. This oscillator consists of the two transistors T2 and T3 which, in the example of embodiment shown in FIG. 2, are of pnp-conductivity type and, consequently, of the same conductivity type as the transistors arranged as constant current sources.

As in the example of embodiment according to FIG. 1 the collectors of the pnp-type transistors 22 and 4 acting as constant current sources, are connected to the emitters of transistors T2 and T3 while the emitters of the transistors 22 and 4 are connected to the voltage-conducting pole + of the supply-voltage source $U_B$. The two emitters of transistors T2 and T3 and, consequently, also the two collectors of transistors 22 and 4 serving as constant current sources, are connected to one another via the quartz crystal Q. The base and the collector electrodes of transistors T2 and T3 are cross-coupled, i.e. the collector of transistor T2 is connected to the base of transistor T3, and the collector of transistor T3 is connected to the base of transistor T2. From the respective connecting point, the collector resistors R2 and R3 extend to the zero point of the circuit 0 (ground). The first flip-flop stage 2 of the frequency divider circuit is controlled by the collector of transistor T3, at which point there is originated the sinusoidal voltage having oscillator frequency. To this voltage there are no longer superimposed the lowering of the supply voltage $U_B$ caused by the motor driver circuit. This statement also applies to the oscillator voltage taken off the emitter of transistor T1 of FIG. 1.

While we have described above the principles of our invention in connection with sepcific apparatus it is to be clearly understood that this description is made only by way of example and not as a limitation to the scope of our invention as set forth in the objects thereof and in the accompanying claims.

We claim:

1. An electronic circuit for a quartz crystal watch comprising:

a transistorized quartz crystal oscillator;

a multi-stage frequency divider circuit including transistorized flip-flop stages having switching transistors coupled to the output of said oscillator; and a plurality of transistors, certain of said plurality of transistors being substituted for emitter resistors of said oscillator and others of said plurality of transistors being substituted for collector resistors of said switching transistors of said divider circuit, said plurality of transistors being connected to provide constant current sources;

said transistors of said oscillator and said plurality of transistors are of a conductivity type which is complementary to the conductivity type of said switching transistors.

2. A circuit according to claim 1, wherein at least all active elements of said oscillator and said divider circuit are combined in one bipolar monolithic integrated semiconductor circuit, and said plurality of transistors are combined in an integrated semiconductor circuit to form at least one multiple constant current source.

3. A circuit according to claim 2, wherein said plurality of transistors have a common base connection; and further including a positive supply voltage source, and a capacitor having a capacitance greater than 10 nanofarads is connected between said common base connection and said voltage source.

4. A circuit according to claim 3, wherein said oscillator includes ground potential, a single transistor having its emitter directly connected to the collector of one of said plurality of transistors and its collector directly connected to said ground potential, a first capacitor directly connected between the emitter of said single transistor and said ground potential, a second capacitor and a resistor directly connected in parallel with each other and directly connected between the base of said single transistor and said ground potential, a quartz crystal directly connected between the emitter and the base of said single transistor, and the emitter of said one of said plurality of transistors is directly connected to said voltage source.

5. A circuit according to claim 3, wherein said oscillator includes ground potential, a first transistor having its emitter directly connected to the collector of one of said plurality of transistors, a second transistor having its emitter directly connected to the collector of another of said plurality of transistors, the emitter of said one and said another of said plurality of transistors is directly connected to said voltage source, the base of said first transistor is directly connected to the collector of said second transistor, the base of said second transistor is directly connected to the collector of said first transistor, a quartz crystal directly connected between the emitters of said first and second transistors, a first resistor directly connected between the collector of said first transistor and said ground potential, and a second resistor directly connected between the collector of said second transistor and said ground potential.

* * * * *